United States Patent
Peng

(10) Patent No.: US 7,091,657 B2
(45) Date of Patent: Aug. 15, 2006

(54) ORGANIC ELECTRO-LUMINESCENT DISPLAY DEVICE AND METHOD FOR MANUFACTURING THE SAME

(76) Inventor: Kuan-Chang Peng, No.8, LN 213, Sec. 2, Jinggguo Rd., Hsinchu (TW) 300

( * ) Notice: Subject to any disclaimer, the term of this patent is extended or adjusted under 35 U.S.C. 154(b) by 405 days.

(21) Appl. No.: 10/378,639

(22) Filed: Mar. 5, 2003

(65) Prior Publication Data

US 2003/0230975 A1 Dec. 18, 2003

(30) Foreign Application Priority Data

May 23, 2002 (TW) .................. 91110962 A

(51) Int. Cl.
*H01J 1/62* (2006.01)
(52) U.S. Cl. .................. 313/498; 315/169.1
(58) Field of Classification Search ........ 313/498–512; 315/169.1, 169.3
See application file for complete search history.

Primary Examiner—Joseph Williams
(74) Attorney, Agent, or Firm—Rosenberg, Klein & Lee

(57) ABSTRACT

A passive matrix organic EL display device suitable for use in a large-scale display panel and a method for manufacturing the same are provided. The organic EL display device comprises a substrate, on which are formed a first electrode, a light-emitting layer, a second electrode and a protective layer. On the protective layer are formed, in turn, a third extending conductive wire that extends parallel with the first electrode, a third isolation layer and a fourth extending conductive wire that extends parallel with the second electrode. The third extending conductive wire is used for connecting first electrodes (data lines) of another unit display panel and a column driver. The fourth extending conductive wire is used for connecting second electrodes (scanning lines) of still another unit display panel and a raw driver. Accordingly, all the data lines and the scanning lines on respective unit display panels can be respectively connected to corresponding column drivers and corresponding raw drivers to complete a large-scale display panel.

15 Claims, 6 Drawing Sheets

ORGANIC ELECTRO-LUMINESCENT DISPLAY DEVICE AND METHOD FOR MANUFACTURING THE SAME

BACKGROUND OF THE INVENTION

1. Field of the Invention

The present invention generally relates to an organic electro-luminescent (to be abbreviated as "EL" hereinafter) display device and a method for manufacturing such an organic EL display device and, more particularly, to a passive matrix organic EL display device for use in a large-scale display panel and a method for manufacturing the organic EL display device.

2. Description of the Prior Art

The organic EL device has attracted tremendous attention due to its advantages over other display devices. These advantages include a larger visual angle, shorter response time, a smaller dimension in thickness, lower power consumption, simpler fabrication, no need for backlighting, and the ability for light emitting in a full color range.

Please refer to FIG. 1, which a cross-sectional view showing the structure of an organic EL device in accordance with the prior art. The organic EL device is characterized in that a first electrode 13 is formed on a substrate 11, and on the first electrode 13 there are a light-emitting layer 17 comprising an organic layer, a second electrode 15 and a protective layer 19 formed by evaporation or sputtering in turn. Electrons and holes are injected from the first electrode 13 and the second electrode 15 and then recombined in the light-emitting layer 17 so as to excite the light-emitting material in the light-emitting layer 17 and emit light.

From the viewpoints of driving mechanism of organic EL devices, organic EL devices can be divided into two categories: the passive matrix organic EL device and the active matrix organic EL device. The passive matrix organic EL device has a simpler structure than the active matrix organic EL device, and there is neither a thin film transistor liquid crystal display (TFT-LCD) panel nor a color filter required. Therefore, the fabrication complexity as well as fabrication cost for the passive matrix organic EL device is much lower. However, in a large-scale display panel composed of passive matrix organic EL devices, the pixels are driven in proper sequence. Hence, a large current is required to be injected into the pixels in a very short time so as to prolong the light-emitting time of the pixels. This leads to a limited number of scanning lines and poor resolution insufficient for a large-scale display panel.

On the contrary, in a large-scale display panel composed of active matrix organic EL devices, a larger number of scanning lines are allowed and the resolution is improved for a large-scale display panel. However, the pixels are driven by using independent thin film transistor circuits and low-temperature poly-silicon TFT technology is required for manufacturing active matrix organic EL devices. In other words, the fabrication of active matrix organic EL devices is critical because the cost is increased due to considerable fabrication complexity and mass production is not yet achieved for low-temperature poly-silicon TFT technology. Therefore, the passive matrix organic EL device still plays the major role in the OELD-related industry.

Please refer to FIG. 2, which is a block circuit diagram showing conventional passive matrix organic EL devices combined as a unit display panel in accordance with the prior art. As shown in FIG. 2, the unit display panel 21 is composed of a plurality of data lines 235 formed of first electrodes (indicated by 13 in FIG. 1) of organic EL devices and a plurality of scanning lines 255 formed of second electrodes (indicated by 15 in FIG. 1) of the organic EL devices. All the data lines 235 and the scanning lines 255 are connected, respectively, to a corresponding column driver 23 and a corresponding raw driver 25, which are further connected to a central controller 27 that controls through the column driver 23 and the raw driver 25 so as to determine which pixel (as indicated by a "spot" in FIG. 2) to emit light.

In order to implement the unit display panel for possible application in practical cases, the industry has managed to combine a plurality of OELD unit display panels as a large-scale display panel 31. As shown in FIG. 3, which is a 2×2 display device composed of four OELD unit display panels. The data lines 335 and the scanning lines 355 for each unit display panel are connected, respectively, to a corresponding column driver 33A1~33A4 and a corresponding raw driver 35B1~35B4. Each of the column drivers 33A1~33A4 and the raw drivers 35B1~35B4 is further connected to a central controller 37 that controls through the column drivers 33A1~33A4 and the raw drivers 35B1~35B4 so as to determine which pixel (as indicated by a "spot" in FIG. 3) to emit light. Even though this structure has a relatively larger size, the data lines 335 and the scanning lines 355 for each unit display panel have to be directly connected to the corresponding column driver 33A1~33A4 and the corresponding raw driver 35B1~35B4, respectively. Therefore, such a structure is only applicable as a 2×2 display device. In other words, a 2×3 or larger display device can not be implemented, because any unit display panel on the third column or the third raw has no corresponding column driver or corresponding raw driver to be connected to through the data lines or the scanning lines. Accordingly, such a passive matrix OELD display device has a size limit that cannot be further increased.

Therefore, there is need in providing a passive matrix organic EL display device and a method for manufacturing such an organic EL display device.

SUMMARY OF THE INVENTION

Accordingly, it is the primary object of the present invention to provide an organic EL display device for use in a large-size display panel comprising a plurality of unit display panels such that the passive matrix organic EL device display is applicable to display panels of all sizes and types.

It is another object of the present invention to provide an organic EL display device with modifications of device structure and connection arrangement such that the passive matrix organic EL device display is applicable to large-size and high-resolution display panels.

It is still another object of the present invention to provide an organic EL display device with a simplified structure such that the passive matrix organic EL device display is applicable to display panels of all sizes and types.

It is yet another object of the present invention to provide an organic EL display device applicable to large-size and high-resolution display panels without employing any active matrix organic EL device display such that mass production can be achieved with lowered cost without using low-temperature poly-silicon TFT technology.

In order to achieve the foregoing objects, the present invention provides an organic electro-luminescence (EL) display device, comprising at least a first unit display panel, said first unit display panel comprising: a substrate; at least a first electrode formed on said substrate; at least a light-emitting layer, formed on said first electrode; a second electrode, formed on said light-emitting layer; a protective layer, formed on said second electrode; and at least a third extending conductive wire, formed on said protective layer and connected through a third connecting wire to one of a first electrode and a second electrode on a third unit display panel.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic electro-luminescent (EL) display device and a method for manufacturing such an organic EL display device can be exemplified by the preferred embodiments as described hereinafter.

Figure 4:
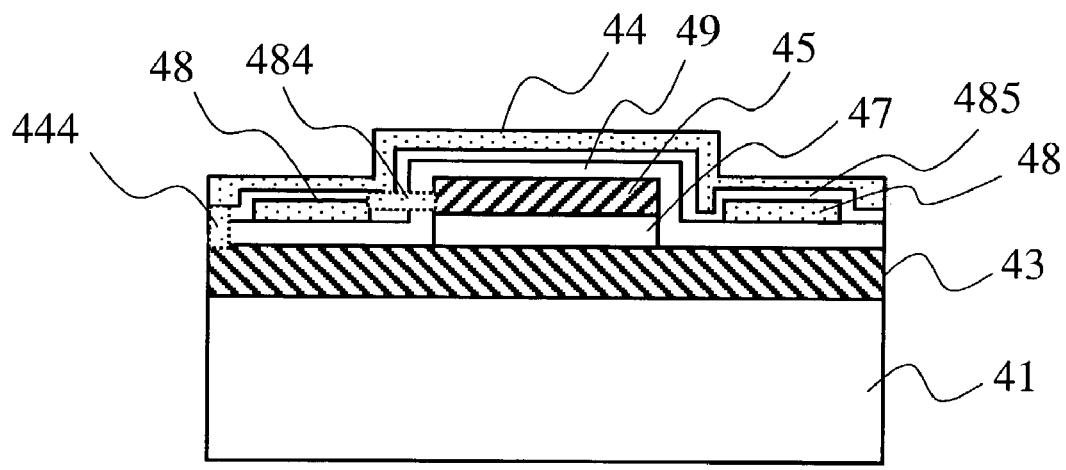
FIG. 4 is a cross-sectional view showing the structure of an organic EL display device in accordance with one preferred embodiment of the present invention.
Figure 5:
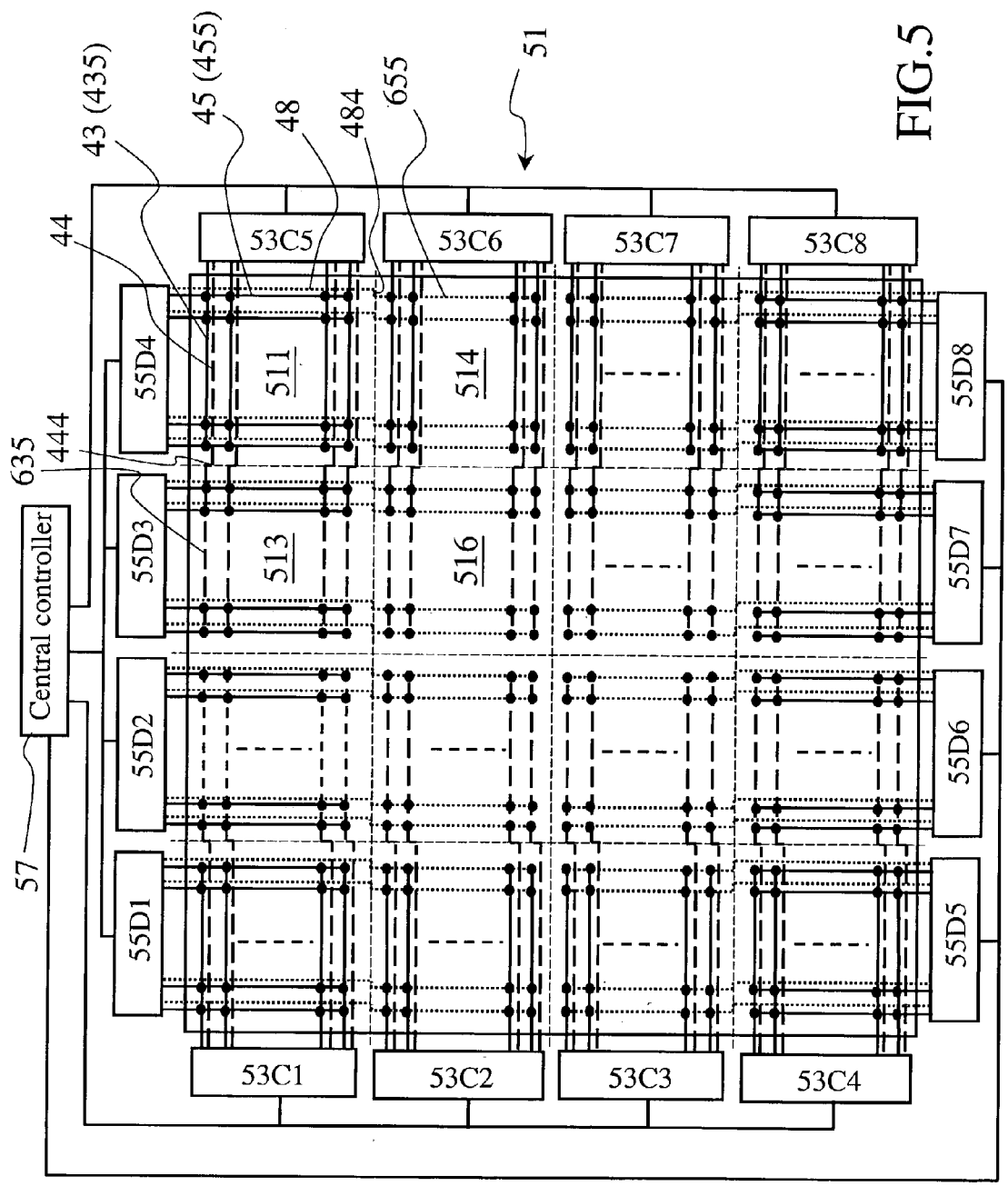
FIG. 5 is a schematic diagram showing an organic EL display device composed of unit display panels in accordance with still one preferred embodiment of the present invention.

To start with, please refer to FIG. 4, which is a cross-sectional view showing the structure of an organic EL display device in accordance with one preferred embodiment of the present invention. As shown in FIG. 4, a first electrode 43 is formed on a substrate 41, and on the first electrode 43 there are a light-emitting layer 47 comprising an organic layer, a second electrode 45 and a protective layer 49 formed in turn by evaporation or sputtering. On the surface of the protective layer 49 is formed at least a fourth extending conductive wire 48 that extends parallel with the second electrode 45. The fourth extending conductive wire 48 is connected through a fourth connecting wire 484 to a second electrode (a fourth scanning-line 655 as shown in FIG. 5) of another unit display panel (a fourth unit display panel). On the surface of the fourth extending conductive wire 48 is disposed a fourth isolation layer 485 that insulates. On the surface of the fourth isolation layer 485 is formed a third extending conductive wire 44 that extends parallel with the first electrode 43. The third extending conductive wire 44 is connected through a third connecting wire 444 to a second electrode (a third scanning line 635 as shown in FIG. 5) of still another unit display panel (a third unit display panel).

Figure 6:
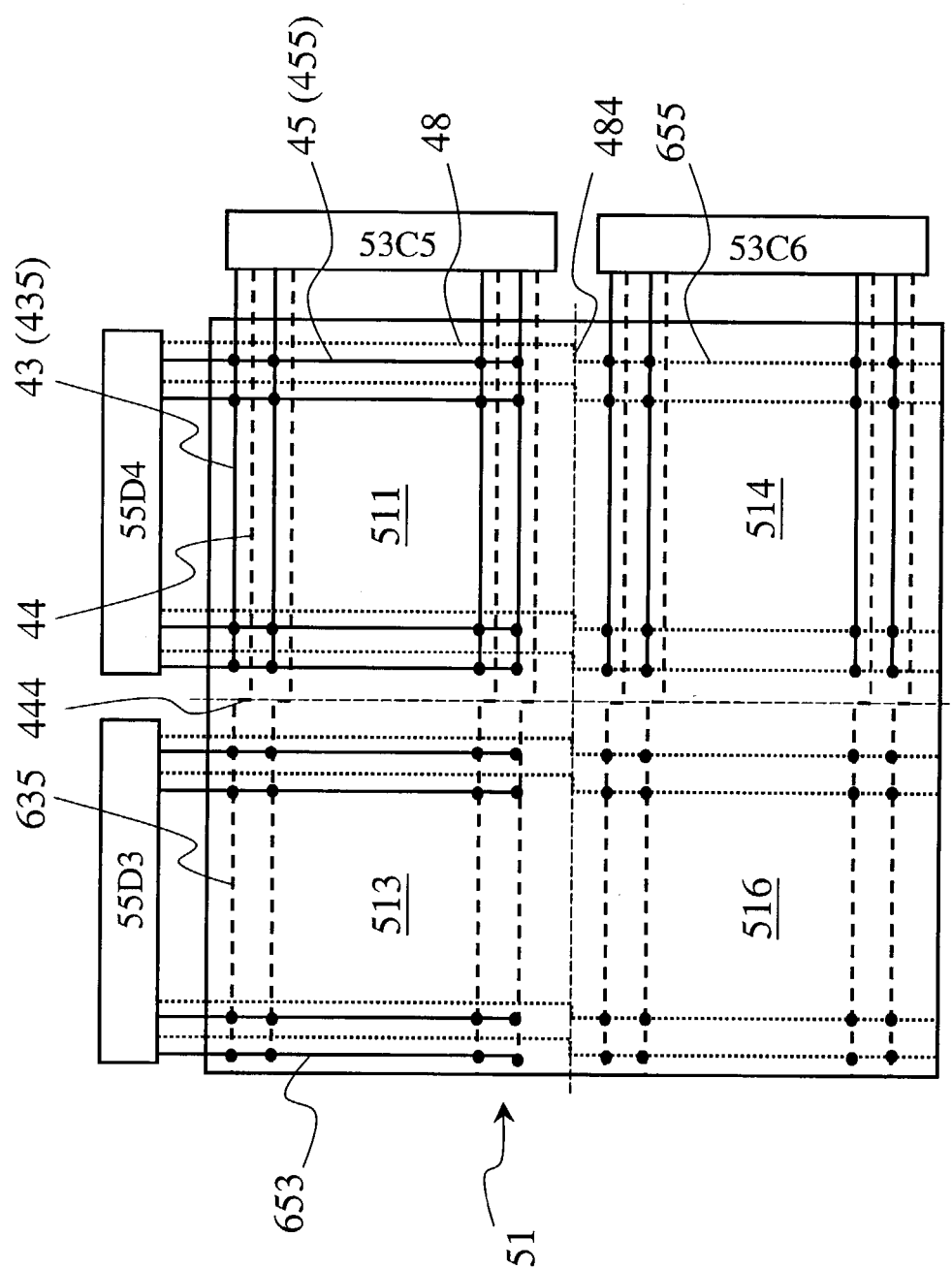
FIG. 6 is an exploded view of a portion in FIG. 5.

Furthermore, please also refer to FIG. 5, which is a schematic diagram showing organic EL display device composed of unit display panels in accordance with still one preferred embodiment of the present invention, and FIG. 6, which is an exploded view of a portion in FIG. 5. As shown in these figures, a large-scale display panel such as a 4×4 display device is composed of a plurality of unit display panels, in which each of the unit display panel is composed of at least a data line (for example, the first data lines 435 of a first unit display panel 511) formed of the first electrode (43) and at least a scanning line (for example, the first scanning lines 455 of the first unit display panel 511) formed of the second electrode (45). The data lines (for example, the first data lines 435 of the first unit display panel 511) and the scanning lines (for example, the first scanning lines 455 of the first unit display panel 511) of unit display panels adjacent to one of column drivers 53C1~53C8 or one of raw drivers 55D1~55D8 are directly connected to one of the column drivers 53C1~53C8 or one of the raw drivers 55D1~55D8.

On the first unit display panel 511, the third extending conductive wires 44 (as indicated by the dashed line) that extend parallel with the first scanning lines 435 are connected through the third connecting wire 444 neighboring the third unit display panel 513 to the first electrodes 635 (the third data lines as indicated by the dashed line) on the third unit display panel 513. Accordingly, the unit display panels not neighboring the column driver 513, for example the third unit display panel 513, can be connected through the third connecting wire 444 and the third extending conductive wires 44 to the column driver 53C5 by bypassing the first unit display panel 511. As a result, the third data lines 635 and third scanning lines 653 on the third unit display panel 513 are connected, respectively, to the corresponding column driver 53C5 and the corresponding raw driver 55D3, which are further connected to a central controller 57 that controls through the column drivers 53C1~53C8 and the raw drivers 55D1~55D8 so as to determine which pixels (as indicated by "spots") on the third unit display panel 513 to emit light.

Furthermore, on the fourth unit display panel 514 not neighboring the raw driver 55D4, the second electrodes 655 (the fourth scanning lines as indicated by the dotted line) can be connected through the fourth connecting wire 484 and the fourth extending conductive wires 48 to the raw driver 55D4 by bypassing the first unit display panel 511. As a result, the fourth data lines and fourth scanning lines on the fourth unit display panel 514 are connected, respectively, to the corresponding column driver 53C6 and the corresponding raw driver 55D4.

Similarly, on the unit display panels neither neighboring the column drivers nor neighboring the raw drivers, for example the sixth unit display panel 516, the data lines (as indicated by the dashed line) and the scanning lines (as indicated by the dotted line) are connected, respectively, through the connecting wires and the extending conductive wires to the corresponding column driver 53C6 and the corresponding raw driver 55D3 by bypassing the third unit display panel 513 and the fourth unit display panel 514. As a result, the data lines and scanning lines are connected to the central controller 57 so as to determine which pixels (as indicated by "spots") on the third unit display panel 513 to emit light. Accordingly, on the unit display panels, neighboring the column drivers and/or the raw drivers or not, the data lines and the scanning lines can be connected, respectively, through the connecting wires and the extending conductive wires to the corresponding column drivers and/or the corresponding raw drivers.

Figure 1:
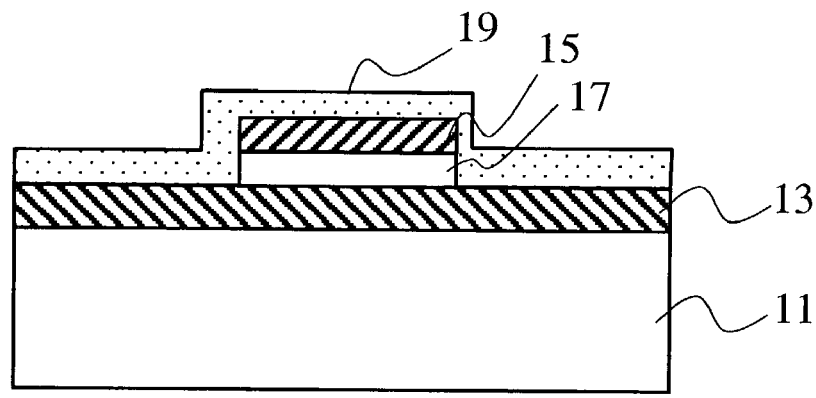
FIG. 1 is a cross-sectional view showing the structure of an organic EL device in accordance with the prior art.
Figure 2:
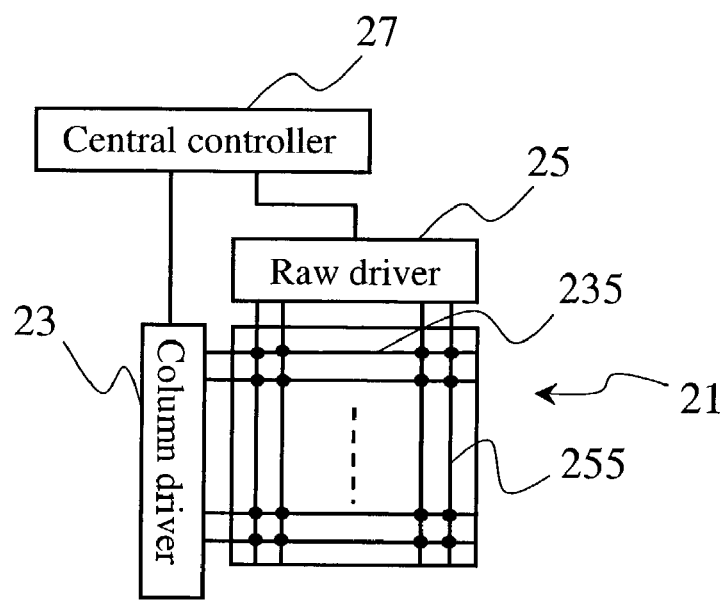
FIG. 2 is a schematic diagram showing conventional passive matrix organic EL devices combined as a unit display panel in accordance with the prior art.
Figure 3:
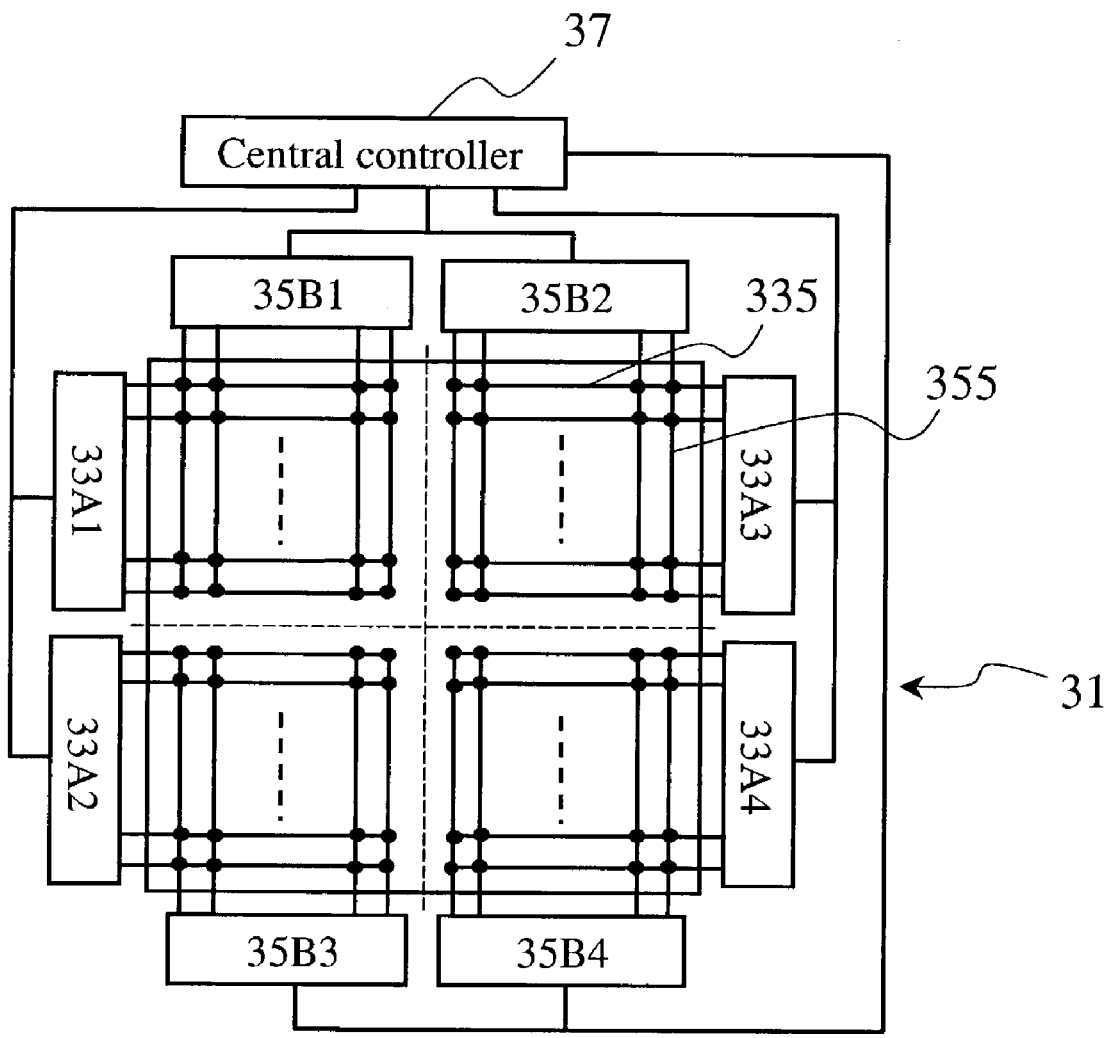
FIG. 3 is a schematic diagram showing an organic EL display device composed of unit display panels in accordance with the prior art.
Figure 7:
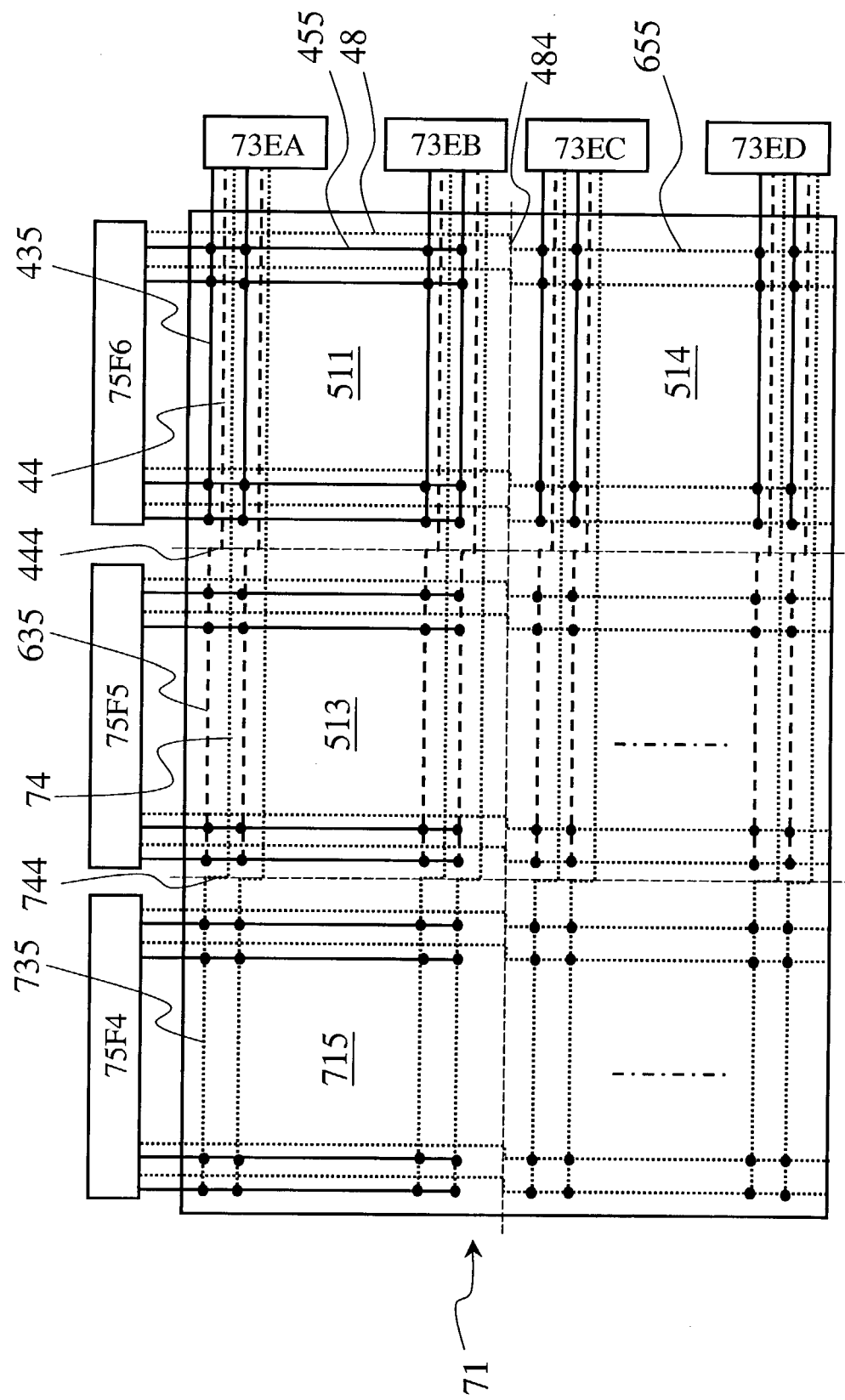
FIG. 7 is a schematic diagram showing an organic EL display device composed of unit display panels in accordance with another embodiment of the present invention.

Please further refer to FIG. 7, which is a schematic diagram showing an organic EL display device composed of unit display panels in accordance with another embodiment of the present invention. As shown in FIG. 7, in the present embodiment, a 2×3 display device 71 is obtained by modifying a conventional 2×3 display device (as shown in FIG. 3). The first electrodes 735 (the fifth data lines as indicated by the dotted line) on the fifth unit display panel 715 are connected through the fifth extending conductive wires 74 and the fifth connecting wire 744 to the corresponding column driver 73EA by bypassing the third unit display panel 513 and the first unit display panel 511. Therefore, on the unit display panels, neighboring the column drivers and/or the raw drivers or not, the data lines and the scanning lines can be connected, respectively, through the connecting wires and the extending conductive wires to the corresponding column drivers 73E~73ED and/or the corresponding raw drivers 75F4~75F6. Accordingly, the passive matrix organic EL display device is suitable for use in display panels of all sizes and types so as to overcome the drawback that the conventional passive matrix organic EL display device has a size limit that cannot be further increased.

It is noted, in the present embodiment, that the number of column drivers 73EA~73ED neighboring the first unit display panel 511 and the fourth unit display panel 514 can be increased according to the number of connected scanning lines and a plurality of column drivers 73EA~73EB can be disposed on one side of a single unit display panel. Since the central controller integrates all the column drivers and the raw drivers, mal-function due to augmentation is prevented. Similarly, the number of scanning lines and/or data lines can be increased on a display panel of the same size so as to achieve high-resolution with increased number of pixels.

Figure 8:
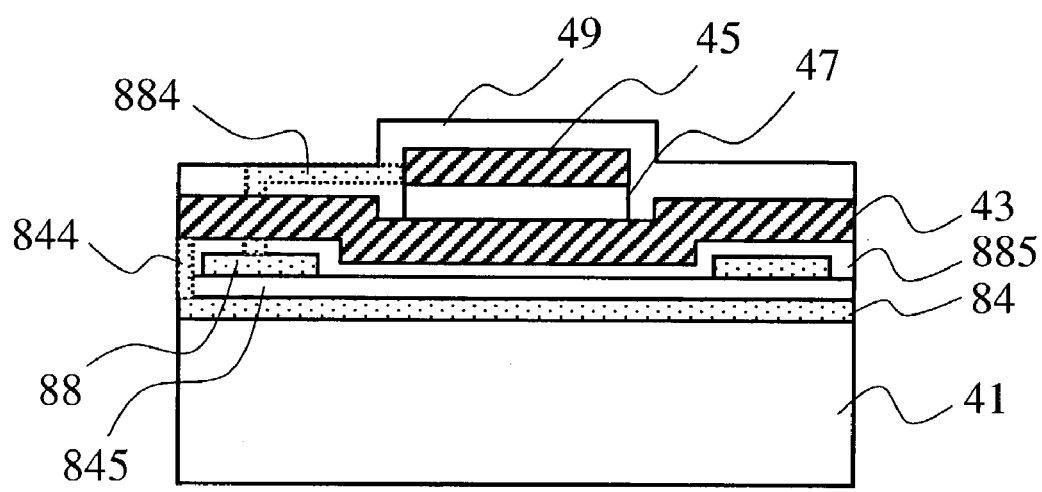
FIG. 8 is a cross-sectional view showing the structure of an organic EL display device in accordance with another embodiment of the present invention.

Please further refer to FIG. 8, which is a cross-sectional view showing the structure of an organic EL display device in accordance with another embodiment of the present invention. As shown in FIG. 8, in the present embodiment, for the purposes of a simplified manufacture processing and a better light-emitting position on the organic EL display device, after a third extending conductive wire 84, a third isolation layer 845, a fourth extending conductive wire 88, and a third isolation layer 885 are formed on a substrate 41, a first electrode 43, a light-emitting layer 47, a second electrode 45 and a protective layer 49 are formed on the third isolation layer 885 that insulates. Similarly, the third extending conductive wire 84 is connected through a third connecting wire 844 to a first electrode on another unit display panel, while the fourth extending conductive wire 88 is connected through a fourth connecting wire 884 to a second electrode on still another unit display panel.

Certainly, the first electrode, the second electrode, the connecting wires or the extending conductive wires are designed according to the types of organic EL display devices as well as the light-emitting positions and can be implemented by using a transparent material.

According to the above discussion, the present invention discloses an organic electro-luminescent (EL) display device and a method for manufacturing such an organic EL display device. Therefore, the present invention has been examined to be new, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescence (EL) display device, comprising at least a first unit display panel and at least a second unit display panel, each of said at least first and second unit display panels comprising:
   a substrate;
   at least a first electrode formed on said substrate;
   at least a light-emitting layer, formed on said first electrode;
   a second electrode, formed on said light-emitting layer; and
   a protective layer, formed on said second electrode;
   wherein said at least first unit display panel further includes at least one auxiliary extending conductive wire, formed on said protective layer, and at least one auxiliary connecting wire, said at least one auxiliary extending conductive wire being connected through said at least one auxiliary connecting wire to one of said at least first and said second electrodes of said at least one second unit display panel.

2. The organic EL display device as recited in claim 1, further comprising a plurality of columns drivers and a plurality of raw drivers, wherein said at least first electrode, said second electrode, and said at least one auxiliary extending conductive wire of said at least first unit display panel are respectively connected to one of at least a corresponding one of said plurality of column drivers, a corresponding one of said plurality of raw drivers, and a combination thereof.

3. The organic EL display device as recited in claim 1, further comprising:
   at least a third unit display panel including said first and second electrodes,
   an isolation layer, formed on said at least one auxiliary extending conductive wire; and
   at least a second auxiliary extending conductive wire, formed on said isolation layer and connected through a second auxiliary connecting wire to a respective one of said at least first electrode and second electrode of said at least third unit display panel.

4. The organic EL display device as recited in claim 3, further comprising a plurality of column drivers and a plurality of raw drivers, wherein said at least one second auxiliary extending conductive wire is connected to one of at least a corresponding one of said plurality of column drivers, a corresponding one of said plurality of raw drivers, and a combination thereof.

5. The organic EL display device as recited in claim 3, further comprising:
   a fourth unit display panel having said first and second electrodes,
   a second isolation layer, formed on said second auxiliary extending conductive wire; and
   at least a third auxiliary extending conductive wire, connected to said corresponding column driver, said corresponding raw driver and combination thereof, and connected through a third auxiliary connecting wire to one of said first and second electrodes of said fourth unit display panel.

6. The organic EL display device as recited in claim 2, further comprising a central controller connected to said plurality of column drivers and said plurality of raw drivers.

7. The organic EL display device as recited in claim 1, wherein said at least one auxiliary extending conductive wire extends in parallel with said at least first electrode of said at least first unit display panel.

8. The organic EL display device as recited in claim 3, wherein said at least second auxiliary extending conductive wire extends in parallel with said second electrode of said at least first unit display panel.

9. The organic EL display device as recited in claim 5, wherein said at least third auxiliary extending conductive wire extends in parallel with said at least first electrode of said at least first unit display panel.

10. An organic electro-luminescence (EL) display device, comprising at least a first and a second unit display panels, each of said first and second unit display panels including at least one first and at least one second electrodes, said first unit display panel comprising:
   a substrate;
   at least a first auxiliary extending conductive wire, formed on said substrate and connected through a first auxiliary connecting wire to one of said first electrode and a second electrode of said second unit display panel;
   an isolation layer, formed on said first auxiliary extending conductive wire, said at least first electrode, being formed on said isolation layer; and
   at least a light-emitting layer, formed on said at least first electrode, said at least second electrode, being formed on said light-emitting layer.

11. The organic EL display device as recited in claim 10, further comprising:
   a third unit display panel having at least one said first and at least one said second electrodes;
   at least a second auxiliary extending conductive wire, formed on said isolation layer and connected through a second auxiliary connecting wire to one of said first electrode and said second electrode of said third unit display panel; and
   an additional isolation layer, formed on said second auxiliary extending conductive wire, wherein said first electrode, said light-emitting layer and said second electrode of said first unit display panel are formed on said additional isolation layer.

12. The organic EL display device as recited in claim 10, wherein said first electrode, said second electrode and said auxiliary extending conductive wire of said first unit display panel are respectively connected to one of a corresponding column driver, a corresponding raw driver, and a combination thereof.

13. The organic EL display device as recited in claim 11, wherein said second auxiliary extending conductive wire is connected to one of a corresponding column driver, a corresponding raw driver, and a combination thereof.

14. The organic EL display device as recited in claim 11, further comprising:
   a fourth unit display panel having at least one said first and at least one said second electrode.
   a second additional isolation layer, formed on said second auxiliary extending conductive wire; and at least a third auxiliary extending conductive wire, connected to one of said corresponding column driver, said corresponding raw driver, and combination thereof, and connected to one of said first electrode and said second electrode of said fourth unit display panel through said third auxiliary connecting wire.

15. The organic EL display device as recited in claim 10, wherein said display device is a passive matrix organic EL display device.

* * * * *